US012787485B2

(12) United States Patent
Wei et al.

(10) Patent No.: US 12,787,485 B2
(45) Date of Patent: Nov. 3, 2026

(54) PREPARATION METHOD FOR SOLAR CELL, AND SOLAR CELL

(71) Applicant: TONGWEI SOLAR (CHENGDU) CO., LTD., Chengdu (CN)

(72) Inventors: Kesheng Wei, Chengdu (CN); Yi Yu, Chengdu (CN); Jin Wang, Chengdu (CN); Lei Xu, Chengdu (CN)

(73) Assignee: TONGWEI SOLAR (CHENGDU) CO., LTD., Chengdu (CN)

( * ) Notice: Subject to any disclaimer, the term of this patent is extended or adjusted under 35 U.S.C. 154(b) by 1 day.

(21) Appl. No.: 19/124,658

(22) PCT Filed: May 30, 2023

(86) PCT No.: PCT/CN2023/097065
§ 371 (c)(1),
(2) Date: Apr. 25, 2025

(87) PCT Pub. No.: WO2024/087620
PCT Pub. Date: May 2, 2024

(65) Prior Publication Data
US 2026/0182075 A1 Jun. 25, 2026

(30) Foreign Application Priority Data
Oct. 27, 2022 (CN) ......................... 202211322806.3

(51) Int. Cl.
*H10F 71/00* (2025.01)
*H10F 77/30* (2025.01)

(52) U.S. Cl.
CPC ........... *H10F 71/00* (2025.01); *H10F 71/121* (2025.01); *H10F 77/311* (2025.01)

(58) Field of Classification Search
CPC ....... H10F 71/00; H10F 71/121; H10F 77/311
See application file for complete search history.

(56) References Cited

U.S. PATENT DOCUMENTS

2016/0133779 A1 5/2016 Adachi et al.

FOREIGN PATENT DOCUMENTS

| | | | | | |
|---|---|---|---|---|---|
| CN | 104701410 | A | | 6/2015 | |
| CN | 104810428 | A | * | 7/2015 | ........... H10F 71/103 |
| CN | 111326290 | A | | 6/2020 | |
| CN | 114005889 | A | | 2/2022 | |
| CN | 115663066 | A | | 1/2023 | |
| JP | 2014222733 | A | | 11/2014 | |

OTHER PUBLICATIONS

Zeng et al., CN 104810428 A, English Machine Translation. (Year: 2015).*
International Search Report (with English translation) received in corresponding Application No. PCT/CN2023/097065, dated Sep. 8, 2023, 13 pages.
Decision of Grant received in corresponding Application No. CN 202211322806.3, dated Oct. 30, 2023, 3 pages.

* cited by examiner

*Primary Examiner* — Tae-Sik Kang
(74) *Attorney, Agent, or Firm* — Dority & Manning, PA

(57) ABSTRACT

In one aspect, a method for manufacturing a solar cell includes: manufacturing a barrier layer on a transparent conductive film of a solar cell wafer; manufacturing a first copper seed layer on the barrier layer by a chemical copper plating method; manufacturing a second copper seed layer on the first copper seed layer by a sputtering method; and manufacturing a grid line electrode on the second copper seed layer.

19 Claims, 3 Drawing Sheets

PREPARATION METHOD FOR SOLAR CELL, AND SOLAR CELL

CROSS-REFERENCE TO RELATED APPLICATIONS

This application is an U.S. national phase application under 35 U.S.C. § 371 based upon international patent application No. PCT/CN2023/097065, filed on May 30, 2023, which itself claims priority to Chinese patent application No. 2022113228063, filed with Chinese Patent Office on Oct. 27, 2022, entitled "PREPARATION METHOD FOR SOLAR CELL, AND SOLAR CELL". The contents of the above identified applications are hereby incorporated herein in their entireties by reference.

TECHNICAL FIELD

The present disclosure relates to the technical field of solar cells, particularly relates to a method for manufacturing a solar cell, and a solar cell.

BACKGROUND

Traditional fossil fuels have disadvantages such as high levels of pollution and unsustainability. The solar energy is regarded as a sustainable and clean energy source with considerable application potential. Solar cells can absorb solar energy and convert it into electrical energy, making them essential devices for the large-scale utilization of solar energy.

In addition to a semiconductor necessary for converting light energy into electrical energy, the structure of a solar cell typically further includes a transparent conductive film and a grid line electrode to conduct current to an external circuit. Traditional grid line electrodes are usually manufactured by screen printing a conductive silver paste. The high material cost of the conductive silver paste is a major factor contributing to the high production costs of solar cells. Finding alternative materials and processes for silver grid line electrodes is an effective strategy to reduce the production costs of solar cells.

Copper, which has an excellent conductivity and a low cost, is considered as an ideal alternative material. The conventional process for manufacturing a copper grid line electrode generally includes: first sputtering a copper seed layer onto a transparent conductive film, and then manufacturing the copper grid line electrode on the copper seed layer. However, during the sputtering process of the copper seed layer, some copper atoms may ionize to form copper ions with a higher kinetic energy that bombard the surface of the transparent conductive film, which causes morphological defects on the surface of the transparent conductive film, resulting in poor contact between the transparent conductive film and the copper seed layer and reduced cell efficiency. Therefore, the current manufacturing process for the copper seed layer requires further optimization.

SUMMARY

According to some embodiments of the present disclosure, a method for manufacturing a solar cell is provided, which includes the following steps:

- manufacturing a barrier layer on a transparent conductive film of a solar cell wafer;
- manufacturing a first copper seed layer on the barrier layer by a chemical copper plating method;

- manufacturing a second copper seed layer on the first copper seed layer by a sputtering method; and
- manufacturing a grid line electrode on the second copper seed layer.

In some embodiments of the present disclosure, the step of manufacturing the barrier layer includes: placing the solar cell wafer in a cleaning liquid, ultrasonically cleaning the transparent conductive film, and depositing a material of the barrier layer onto the transparent conductive film that has been ultrasonically cleaned.

In some embodiments of the present disclosure, the material of the barrier layer includes one or more of a transition metal sulfide and a metal nitride.

In some embodiments of the present disclosure, the cleaning liquid includes pure water or a dilute hydrochloric acid solution with a mass concentration of 1% to 10%.

In some embodiments of the present disclosure, after manufacturing the barrier layer and before manufacturing the first copper seed layer, the method for manufacturing the solar cell further includes a step of placing the solar cell wafer in an activation solution to be subjected to a copper plating activation treatment.

In some embodiments of the present disclosure, the activation solution includes a buffered oxide etch solution and a chemical copper plating activator.

In some embodiments of the present disclosure, a thickness of the first copper seed layer is 10 nm to 200 nm.

In some embodiments of the present disclosure, a thickness of the second copper seed layer is 100 nm to 200 nm.

In some embodiments of the present disclosure, a thickness of the barrier layer is 1 nm to 10 nm.

In some embodiments of the present disclosure, in the step of manufacturing the second copper seed layer, a deposition rate is 0.4 nm/s to 1.0 nm/s.

In some embodiments of the present disclosure, in the step of manufacturing the second copper seed layer, a temperature is 20° C. to 60° C.

In some embodiments of the present disclosure, the gate line electrode is manufactured by a method selected from chemical copper plating or electrochemical copper plating.

In some embodiments of the present disclosure, the solar cell wafer further includes a silicon substrate, a front intrinsic amorphous silicon layer, a front doped amorphous silicon layer, a back intrinsic amorphous silicon layer, and a back doped amorphous silicon layer. The front intrinsic amorphous silicon layer and the front doped amorphous silicon layer are sequentially stacked on a front side of the silicon substrate. The back intrinsic amorphous silicon layer and the back doped amorphous silicon layer are sequentially stacked on aback side of the silicon substrate. There are two transparent conductive films disposed on the front doped amorphous silicon layer and the back doped amorphous silicon layer, respectively.

According to some further embodiments of the present disclosure, a solar cell is provided, which includes:

- a solar cell wafer including a transparent conductive film;
- a barrier layer disposed on the transparent conductive film;
- a first copper seed layer manufactured by a chemical copper plating method and disposed on the barrier layer;
- a second copper seed layer manufactured by a sputtering method and disposed on the first copper seed layer; and
- a copper grid line electrode disposed on the second copper seed layer.

In some embodiments of the present disclosure, a thickness of the barrier layer is 1 nm to 10 nm.

In some embodiments of the present disclosure, a material of the barrier layer includes one or two of a transition metal sulfide and a nitride.

In some embodiments of the present disclosure, a thickness of the first copper seed layer is 10 nm to 200 nm.

In some embodiments of the present disclosure, a thickness of the second copper seed layer is 100 nm to 200 nm.

In some embodiments of the present disclosure, the solar cell wafer further includes a silicon substrate, a front intrinsic amorphous silicon layer, a front doped amorphous silicon layer, a back intrinsic amorphous silicon layer, and a back doped amorphous silicon layer. The front intrinsic amorphous silicon layer and the front doped amorphous silicon layer are sequentially stacked on the front side of the silicon substrate. The back intrinsic amorphous silicon layer and the back doped amorphous silicon layer are sequentially stacked on the back side of the silicon substrate. There are two transparent conductive films disposed on the front doped amorphous silicon layer and the back doped amorphous silicon layer, respectively.

The details of one or more embodiments of the present disclosure are set forth in the accompanying drawings and the description below. Other features, objects, and advantages of the present disclosure will become apparent from the description, drawings, and the claims.

Figure 1:
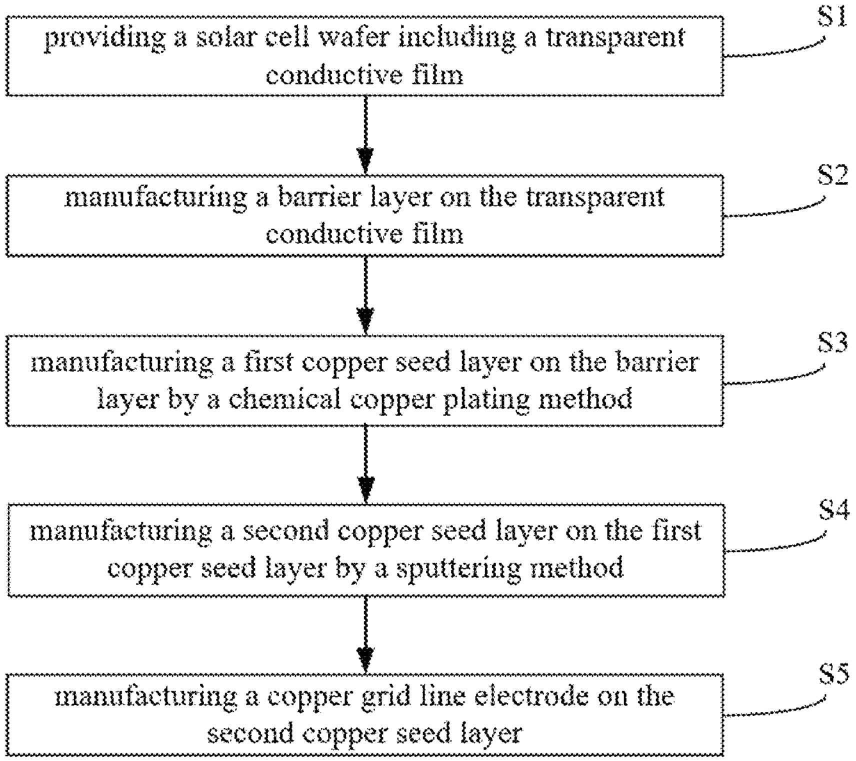
FIG. 1 shows a method for manufacturing a solar cell in an embodiment of the present disclosure.

The reference numerals and their meanings are as follows:

100. Silicon substrate; 111. Front intrinsic amorphous silicon layer; 112. Front doped amorphous silicon layer; 113. Front transparent conductive film; 114. Front blocking layer; 115. Front first copper seed layer; 116. Front second copper seed layer; 117. Front copper grid line electrode; 121. Back intrinsic amorphous silicon layer; 122. Back doped amorphous silicon layer; 123. Back transparent conductive film; 124. Back blocking layer; 125. Back first copper seed layer; 126. Back second copper seed layer; 127. Back copper grid line electrode.

DETAILED DESCRIPTION

In order to facilitate an understanding of the present disclosure, the present disclosure will now be described more comprehensively hereinafter with reference to the accompanying drawings. Preferred embodiments of the present disclosure are shown in the drawings. The present disclosure may, however, be embodied in many different forms and is not limited to the embodiments described herein. On the contrary, the purpose of providing these embodiments is to provide a more thorough and comprehensive understanding of the disclosed content of the present disclosure.

Unless defined otherwise, all technical and scientific terms used herein have the same meaning as commonly understood by a person skilled in the art to which the present disclosure belongs. The terms herein in the description of the present disclosure is for the purpose of describing specific embodiments only and are not intended to limit the present disclosure. As used herein, the term "and/or" includes any or all combinations of one or more related listed items. As used herein, "multiple" includes two and more than two items. As used herein, "above a certain number" should be understood as including the certain number and a range greater than the certain number.

An embodiment of the present disclosure provides a method for manufacturing a solar cell, wherein the method includes the following steps: manufacturing a barrier layer on a transparent conductive film of a solar cell wafer; manufacturing a first copper seed layer on the barrier layer by a chemical copper plating method; manufacturing a second copper seed layer on the first copper seed layer by a sputtering method; and manufacturing a grid line electrode on the second copper seed layer.

In the manufacturing method of the solar cell in the present embodiment, a barrier layer is previously manufactured, which can effectively prevent copper ions from entering the surface of the solar cell wafer, addressing the issue of copper ion contamination of the solar cell wafer, and facilitating the manufacture of a first copper seed layer by a chemical copper plating method. Due to the blocking of the first copper seed layer, in the sputtering and manufacturing process of the second copper seed layer, the copper ions generated are directly absorbed by the first copper seed layer, thereby protecting the transparent conductive film from damage. Moreover, the combination of the first copper seed layer and the second copper seed layer effectively ensures the conductivity of the copper seed layer while ensuring that the transparent conductive film remains undamaged, and effectively improves the electrical contact between the copper seed layer and the transparent conductive film, thereby leading to a significant improvement in the efficiency of the manufactured solar cell.

In order to facilitate an understanding of the specific implementation of the above-mentioned method for manufacturing the solar cell, the present disclosure further provides an embodiment of the method for manufacturing the solar cell, as shown in FIG. 1, which includes steps S1 to S5.

Step S1, Providing a Solar Cell Wafer Including a Transparent Conductive Film.

The solar cell wafer includes a semiconductor component that can convert light energy into electrical energy, and the transparent conductive film is disposed on the semiconductor component and configured to collect current generated by the semiconductor component. In order to conduct the current to an external circuit, it is also necessary to manufacture a grid line electrode on the solar cell wafer.

In some examples of the present embodiment, the solar cell wafer is a wafer of a crystalline silicon solar cell. The crystalline silicon solar cell refers to a solar cell that uses a silicon wafer as a substrate. Optionally, the solar cell wafer is a wafer of a heterojunction solar cell.

Figure 2:
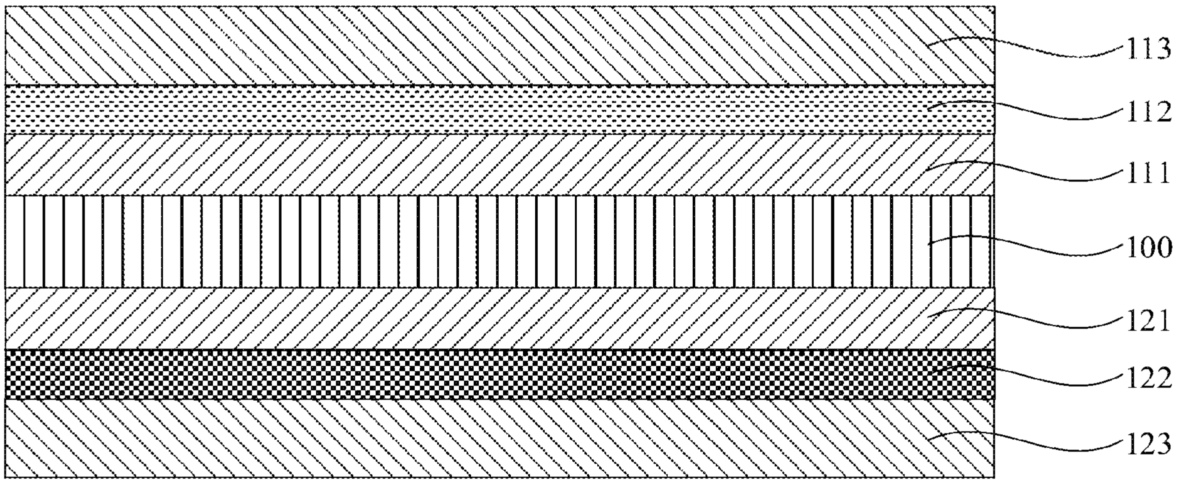
FIG. 2 shows a schematic structural view of a solar cell wafer provided in step S1 of the manufacturing method of FIG. 1.

As shown in FIG. 2, in some examples of the present embodiment, the solar cell wafer includes a silicon substrate 100, a front intrinsic amorphous silicon layer 111, a front doped amorphous silicon layer 112, a back intrinsic amorphous silicon layer 121, and a back doped amorphous silicon layer 122. The front intrinsic amorphous silicon layer 111 is disposed on a front side of the substrate. The front doped amorphous silicon layer 112 is disposed on the front intrinsic amorphous silicon layer 111. The back intrinsic amorphous silicon layer 121 is disposed on a back side of the substrate. The back doped amorphous silicon layer 122 is disposed on the back intrinsic amorphous silicon layer 121. The solar cell wafer includes two transparent conductive films, a front transparent conductive film 113 and a back transparent conductive film 123. The front transparent conductive film 113 is disposed on the front doped amorphous silicon, and the back transparent conductive film 123 is disposed on the back doped amorphous silicon. The front doped amorphous silicon layer 112 and the back doped amorphous silicon layer 122 have different doping types. Optionally, the doping type of the silicon substrate 100 is N-type, the doping type of the front doped amorphous silicon layer 112 is also N-type, and the doping type of the back doped amorphous silicon layer 122 is P-type. It is to be understood that the solar cell wafer is a wafer of a heterojunction solar cell.

In some examples of the present embodiment, a surface of the silicon substrate 100 of the solar cell wafer includes a pyramidal textured surface.

In some examples of the present embodiment, the solar cell wafer may be provided by manufacturing the solar cell wafer in an upstream production line. The manufacturing process of the solar cell wafer may include sequentially depositing an intrinsic amorphous silicon layer, a doped amorphous silicon layer, and a transparent conductive film on the silicon substrate 100. The specific manufacturing method may refer to the existing process.

Step S2, Manufacturing a Barrier Layer on the Transparent Conductive Film.

Figure 3:
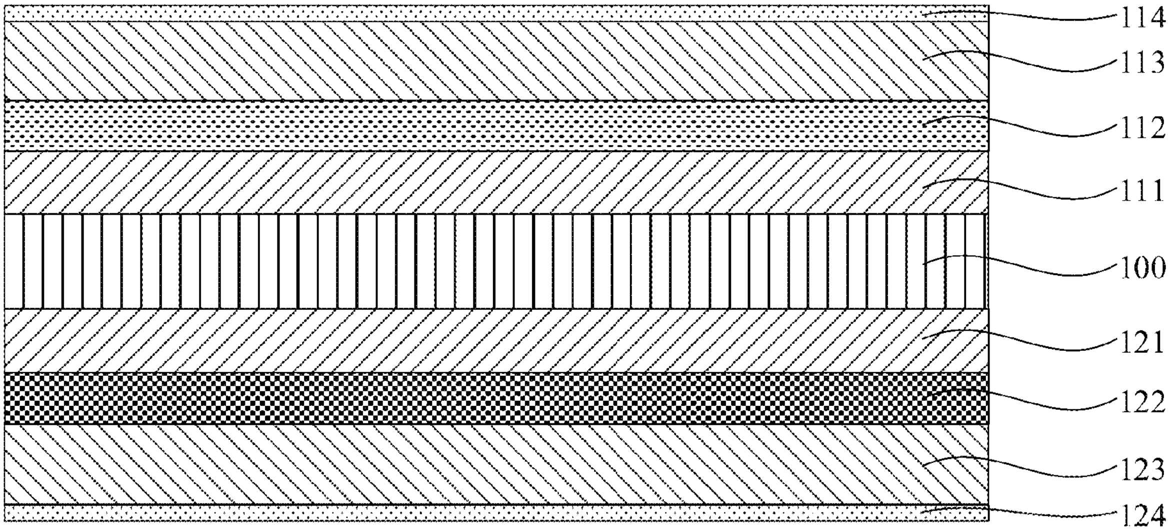
FIG. 3 shows a schematic structural view of a device manufactured in step S2 of the manufacturing method of FIG. 1.

As shown in FIG. 3, the barrier layer is disposed on the transparent conductive film. Optionally, there are two barrier layers, a front barrier layer 114 and a back barrier layer 124, which are disposed on the front transparent conductive film 113 and the back transparent conductive film 123, respectively. The barrier layers are used to block copper ions in a subsequent chemical copper plating process, preventing the contamination of the solar cell wafer with copper ions. It is to be understood that the barrier layer may be light transmissive and conductive to maintain the normal operation of the solar cell.

In some examples of the present embodiment, the barrier layer has a thickness of 1 nm to 10 nm. For example, the thickness of the barrier layer is 1 nm, 3 nm, 5 nm, 8 nm, 10 nm, or within a range between any two of these values. By setting the thickness of the barrier layer to 1 nm to 10 nm, the negative impact of the barrier layer on the solar cell wafer can be minimized while still effectively blocking copper ions.

In some examples of the present embodiment, a material of the barrier layer includes one or both of a transition metal sulfide and a nitride. Optionally, the nitride may be selected from one or more of copper nitride ($Cu_3N$), gallium nitride, and indium nitride, and the transition metal sulfide may include, but is not limited to, molybdenum sulfide.

In some examples of the present embodiment, the barrier layer may be manufactured by a physical vapor deposition method or a chemical vapor deposition method.

In some examples of the present embodiment, the barrier layer may cover the entire transparent conductive film, or may be disposed on a partial area of the transparent conductive film.

In some examples of the present embodiment, before manufacturing the barrier layer on the transparent conductive film, a step of ultrasonically cleaning the solar cell wafer in a cleaning liquid is further included. The role of ultrasonically cleaning the solar cell wafer is to remove impurities, such as particles and dust, from the surface of the solar cell wafer, in preparation for the subsequent manufacture of the barrier layer and deposition of the first copper seed layer, allowing a more sufficient contact between the first copper seed layer and the transparent conductive film, thereby enhancing the electrical performance and the tension.

In some examples of the present embodiment, in the step of ultrasonically cleaning the solar cell wafer in the cleaning liquid, a temperature of the cleaning liquid is 20° C. to 80° C.

In some examples of the present embodiment, in the step of ultrasonically cleaning the solar cell wafer in the cleaning liquid, the cleaning liquid includes pure water, or the cleaning liquid includes a dilute hydrochloric acid solution with a mass concentration of 1% to 10%.

Step S3, Manufacturing a First Copper Seed Layer on the Barrier Layer by a Chemical Copper Plating Method.

Figure 4:
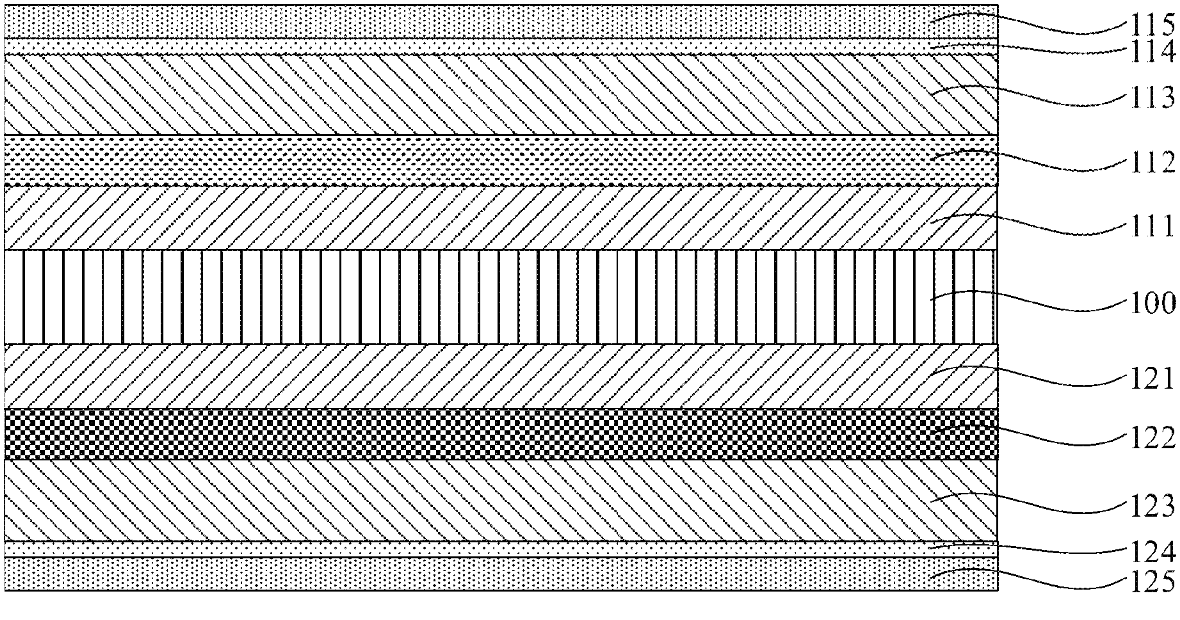
FIG. 4 shows a schematic structural view of a device manufactured in step S3 of the manufacturing method of FIG. 1.

As shown in FIG. 4, the first copper seed layer is disposed on the barrier layer. Optionally, there are two first copper seed layers, a front first copper seed layer 115 and a back first copper seed layer 125, which are disposed on the front barrier layer 114 and the back barrier layer 124, respectively.

The chemical copper plating involves placing a workpiece to be copper-plated in a chemical copper plating liquid containing copper ions, where the copper ions are reduced and the resulting copper is directly deposited onto a surface of the workpiece to be copper-plated, thereby completing the copper plating.

In some examples of the present embodiment, a thickness of the first copper seed layer is 10 nm to 200 nm. Optionally, the thickness of the first copper seed layer is 10 nm to 100 nm. Further optionally, the thickness of the first copper seed layer is 10 nm to 50 nm. For example, the thickness of the first copper seed layer is 10 nm, 20 nm, 30 nm, 40 nm, 50 nm, or within a range between any two of these values.

In some examples of the present embodiment, the plating liquid used in the chemical copper plating contains copper ions and a reducing agent.

In some examples of the present embodiment, the reducing agent includes glyoxylic acid. Optionally, a concentration of glyoxylic acid in the plating liquid is 1.3 g/L to 32.5 g/L. For example, the concentration of glyoxylic acid in the plating liquid is 1.3 g/L, 5 g/L, 10 g/L, 15 g/L, 25 g/L, 32.5 g/L, or within a range between any two of above values.

In some examples of the present embodiment, the plating liquid used in the chemical copper plating includes copper sulfate. A concentration of copper sulfate in the plating liquid is 2 g/L to 25 g/L. For example, the concentration of copper sulfate in the plating liquid is 2 g/L, 5 g/L, 10 g/L, 15 g/L, 25 g/L, or within a range between any two of above values.

In some examples of the present embodiment, the plating liquid used in the chemical copper plating further includes one or more of a complexing agent, a stabilizer, and a foaming agent. Optionally, a concentration of the complexing agent in the plating liquid is 1 g/L to 40 g/L. A concentration of the stabilizer in the plating liquid is 2 mg/L to 40 mg/L. A concentration of the foaming agent in the plating liquid is 2 mg/L to 40 mg/L. Optionally, the complexing agent may include ethylenediaminetetraacetic acid, the stabilizer may include bipyridine, and the foaming agent may include one or more of polyethylene glycol and sodium phenyl polyoxyethylene ether phosphate.

In some examples of the present embodiment, before manufacturing the first copper seed layer, a step of placing the solar cell wafer into an activation solution to be subjected to an activation treatment is also included. The activation treatment is used to form a catalyst on the surface of the solar cell wafer to accelerate the deposition of copper metal on the surface of the solar cell wafer.

In some examples of the present embodiment, the activation solution includes a buffered oxide etch solution and a chemical copper plating activator. Optionally, the chemical copper plating activator includes a palladium salt and nitric acid. The palladium salt may be palladium chloride.

In some examples of the present embodiment, in a step of placing the solar cell wafer into the activation solution to be subjected to the activation treatment, an activation time is 3 s to 100 s. Optionally, an activation temperature is 20° C. to 50° C.

Step S4, Manufacturing a Second Copper Seed Layer on the First Copper Seed Layer by a Sputtering Method.

Figure 5:
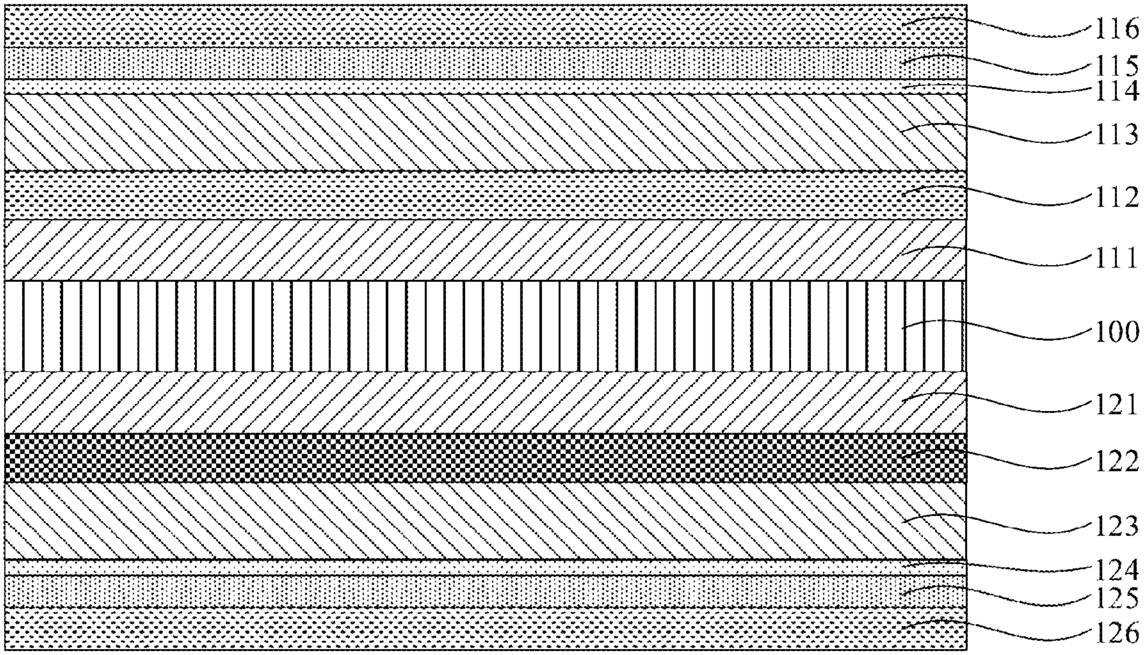
FIG. 5 shows a schematic structural view of a device manufactured in step S4 of the manufacturing method of FIG. 1.

As shown in FIG. 5, the second copper seed layer is disposed on the first copper seed layer. Optionally, there are two second copper seed layers, a front second copper seed layer 116 and a back second copper seed layer 126, which are disposed on the front first copper seed layer 115 and the back first copper seed layer 125, respectively.

The copper film layer manufactured by the sputtering method has high compactness and tensile properties. However, during the sputtering process, some copper atoms may be ionized into copper ions. The copper ions with large kinetic energy may bombard a surface of the transparent conductive film, causing a hole defect on the surface of the transparent conductive film.

In the method for manufacturing the solar cell of the present embodiment, the first copper seed layer is previously formed by the chemical copper plating method, and then the second copper seed layer is sputtered and manufactured onto the first copper seed layer. The first copper seed layer mainly serves to block the sputtered second copper seed layer, and the second copper seed layer cooperates with the first copper seed layer to improve the quality and tension of the copper seed layer. The performance of the solar cell can be effectively improved by combining the first copper seed layer and the second copper seed layer.

In some examples of the present embodiment, a thickness of the second copper seed layer is 100 nm to 200 nm. For example, the thickness of the second copper seed layer is 100 nm, 120 nm, 140 nm, 160 nm, 180 nm, 200 nm, or within a range between any two of above values.

In some examples of the present embodiment, the method for manufacturing the second copper seed layer is selected from magnetron sputtering.

In some examples of the present embodiment, in the step of manufacturing the second copper seed layer, a deposition rate is 0.4 nm/s to 1.0 nm/s.

In some examples of the present embodiment, in the step of manufacturing the second copper seed layer, a sputtering power is 100 W to 2000 W.

In some examples of the present embodiment, in the step of manufacturing the second copper seed layer, a temperature is 20° C. to 60° C.

In some examples of the present embodiment, in the step of manufacturing the second copper seed layer, a protective gas is introduced. Optionally, the protective gas includes argon. Optionally, the protective gas is introduced at a flow rate of 100 sccm to 1200 sccm.

The first copper seed layer and the second copper seed layer act as a seed layer for subsequently manufacturing the copper grid line electrode. The seed layer is disposed between the solar cell wafer and the grid line electrode, which not only assists in the manufacture of the grid line electrode, but also bonds the grid line electrode to the solar cell wafer, ensuring good adhesion and conductivity.

Step S5, Manufacturing a Copper Grid Line Electrode on the Second Copper Seed Layer.

Figure 6:
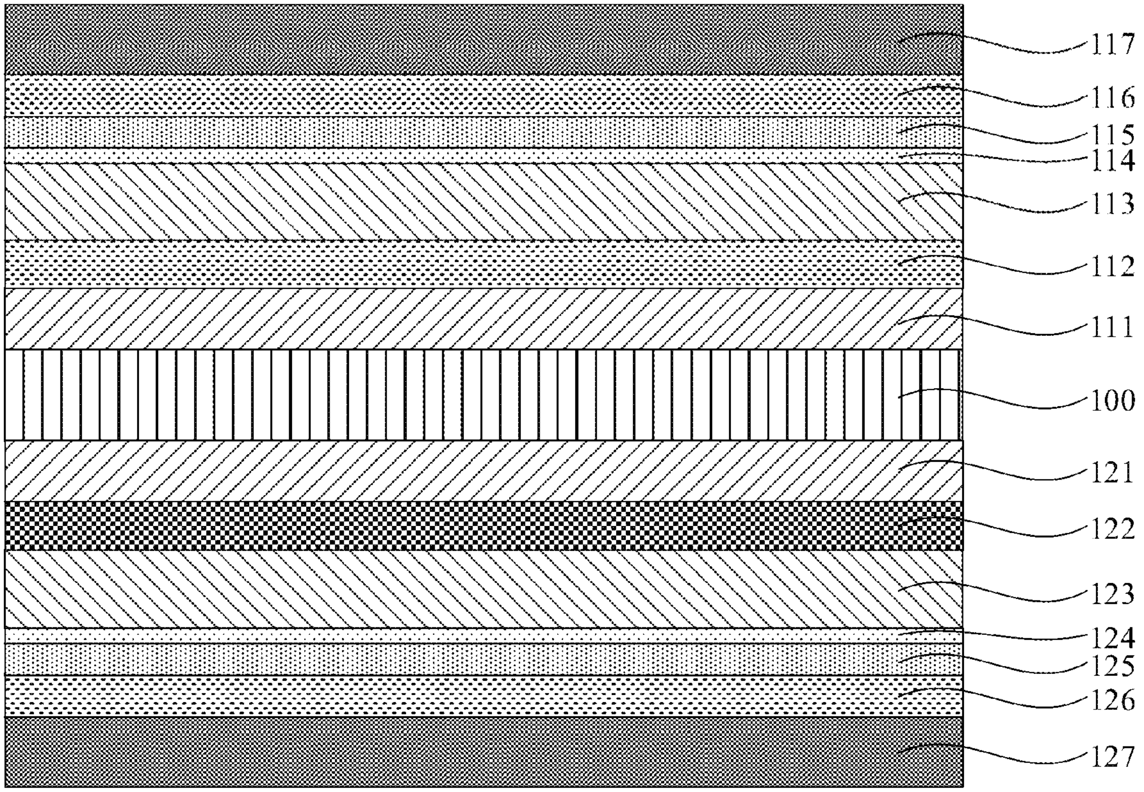
FIG. 6 shows a schematic structural view of a solar cell manufactured by the manufacturing method of FIG. 1.

As shown in FIG. 6, the copper grid line electrode is disposed on the second copper seed layer. Optionally, there are two copper grid line electrodes, a front copper grid line electrode 117 and a back copper grid line electrode 127. The front copper grid line electrode 117 is disposed on the front second copper seed layer 116, and the back copper grid line electrode 127 is disposed on the back second copper seed layer 126.

The copper grid line electrode is a main structure of a gate line electrode. The copper gate line electrode can be manufactured by chemical copper plating or electrochemical copper plating. As the first copper seed layer and the second copper seed layer are previously manufactured, the copper gate line electrode can be selectively grown on the first copper seed layer or the second copper seed layer.

It is to be understood that through steps S1 to S5, the manufacture of the copper seed layer and the copper grid line electrode on the solar cell wafer can be completed.

The damage caused by the bombardment of copper ions during the sputtering manufacture process can be prevented by chemically plating copper. However, the conventional technology may not utilize the chemical copper plating method to manufacture the copper seed layer. This is primarily because, during the chemical copper plating on the transparent conductive film, copper ions may contaminate the solar cell wafer, leading to a performance degradation of the solar cell. Additionally, the copper seed layer manufactured by the chemical copper plating exhibits a poor compactness and a low tension with the transparent conductive film, failing to meet the performance requirements for the copper seed layer.

In the manufacturing method of the solar cell in the above embodiment, a barrier layer is previously manufactured, which can effectively prevent copper ions from entering the surface of the solar cell wafer, addressing the issue of copper ion contamination of the solar cell wafer, and facilitating the manufacture of a first copper seed layer by a chemical copper plating method. Due to the blocking of the first copper seed layer, in the sputtering and manufacturing process of the second copper seed layer, the copper ions generated are directly absorbed by the first copper seed layer, thereby protecting the transparent conductive film from damage. Moreover, the combination of the first copper seed layer and the second copper seed layer effectively ensures the conductivity of the copper seed layer while ensuring that the transparent conductive film remains undamaged, ultimately leading to a significant improvement in the efficiency of the manufactured solar cell.

The present disclosure also provides a solar cell, which includes: a solar cell wafer including a transparent conductive film; a barrier layer disposed on the transparent conductive film; a first copper seed layer manufactured by a chemical copper plating method and disposed on the barrier layer; a second copper seed layer manufactured by a sputtering method and disposed on the first copper seed layer; and a copper grid line electrode disposed on the second copper seed layer.

It is to be understood that the solar cell can be manufactured by the method for manufacturing the solar cell in the above embodiment.

As shown in FIG. 6, in an example of the present embodiment, there are two transparent conductive films, a front transparent conductive film 113 and a back transparent conductive film 123, in the solar cell wafer. There are two barrier layers, two first copper seed layers, two second copper seed layers, and two copper grid line electrodes disposed on a front side and a back side of the solar cell wafer, respectively. A front barrier layer 114, a front first copper seed layer 115, a front second copper seed layer 116, and a front copper grid line electrode 117 are sequentially stacked on the front transparent conductive film 113. Aback barrier layer 124, a back first copper seed layer 125, a back second copper seed layer 126, and a back copper grid line electrode 127 are sequentially stacked on the back transparent conductive film 123.

In order to facilitate the understanding and implementation of the present disclosure, the following more easily implementable and more specific examples and comparative examples are provided for reference. Through the description of the following specific examples and comparative examples, as well as the performance results, the various embodiments of the present disclosure and the advantages thereof will also become apparent.

Unless otherwise specified, raw materials used in the following examples can be commonly available from the market.

The solar cell wafer used in the following examples and comparative examples is a heterojunction solar cell wafer, which includes an N-type silicon substrate with a thickness of 150 m. A front intrinsic amorphous silicon layer, an N-type doped amorphous silicon layer, and a front transparent conductive film are stacked in sequence on a front side of the N-type silicon substrate. A back intrinsic amorphous silicon layer, a P-type doped amorphous silicon layer, and a back transparent conductive film are stacked in sequence on a back side of the N-type silicon substrate. The front transparent conductive film and the back transparent conductive film are each an indium tin oxide film layer with a thickness of 110 nm.

Example 1

Manufacture of Solar Cell Wafer: An N-type doped monocrystalline silicon wafer with a thickness of 150 m was selected, textured, and cleaned to produce a textured surface. Through a plasma enhanced chemical vapor deposition method, an intrinsic amorphous silicon film was deposited on a front side and a back side of the textured silicon wafer, and then an N-type doped amorphous silicon layer was manufactured on the front side and a P-type doped amorphous silicon layer was manufactured on the back side. Through a magnetron sputtering method, an indium tin oxide with a thickness of 110 m was manufactured as a transparent conductive film on each of the front side and the back side of the silicon wafer, thereby obtaining a solar cell wafer.

Manufacture of Barrier Layer: The solar cell wafer was placed in a cleaning liquid and subjected to an ultrasonic cleaning treatment. The cleaning liquid included 70% of pure water and was at a temperature of 35° C. A layer of copper nitride with a thickness of about 5 nm was deposited as a barrier layer on the transparent conductive film.

Manufacture of First Copper Seed Layer: The solar cell wafer was placed into an activation solution and subjected to an activation at 30° C. for 5 s. The activation solution included a buffered oxide etch solution and a chemical copper plating activator. The chemical copper plating activator included a nitric acid-palladium chloride replacement solution. The solar cell wafer was transferred to a plating liquid and subjected to an ultrasonic copper plating. with a thickness of a first copper seed layer controlled to 30 nm. The plating liquid was composed of the following components: 10 g/L of copper sulfate, 2 mL/L of glyoxylic acid, 4 g/L of ethylenediaminetetraacetic acid, 5 mg/L of bipyridine, and 2 μL/L of each of polyethylene glycol and phenyl polyoxyethylene ether sodium phosphate.

Manufacture of Second Copper Seed Layer: The solar cell wafer was placed into a magnetron sputtering chamber, and a second copper seed layer was manufactured on the first copper seed layer by magnetron sputtering at a power of 200 W, with a flow rate of argon gas of 1000 sccm, a deposition rate of 0.5 nm/s, a deposition time of 280 s, a deposition pressure of 0.5 Pa, a deposition temperature of 40° C., and a deposition thickness of 140 nm.

A copper grid line electrode was manufactured on the second copper seed layer.

Comparative Example 1

Manufacture of Solar Cell Wafer: An N-type doped monocrystalline silicon wafer with a thickness of 150 μm was selected, textured, and cleaned to produce a textured surface. Through a plasma enhanced chemical vapor deposition method, an intrinsic amorphous silicon film was deposited on a front side and a back side of the textured silicon wafer, and then an N-type doped amorphous silicon layer was manufactured on the front side and a P-type doped amorphous silicon layer was manufactured on the back side. Through a magnetron sputtering method, an indium tin oxide with a thickness of 110 μm was manufactured as a transparent conductive film on each of the front side and the back side of the silicon wafer, thereby obtaining a solar cell wafer.

Manufacture of Copper Seed Layer: The solar cell wafer was placed into a magnetron sputtering chamber, and a copper seed layer was manufactured on the solar cell wafer by magnetron sputtering at a power of 200 W, with a flow rate of argon gas of 1000 sccm, a deposition rate of 0.5 nm/s, a deposition time of 340 s, a deposition pressure of 0.5 Pa, a deposition temperature of 40° C., and a deposition thickness of 170 nm.

A copper grid line electrode was manufactured on the copper seed layer.

Comparative Example 2

Manufacture of Solar Cell Wafer: An N-type doped monocrystalline silicon wafer with a thickness of 150 m was selected, textured, and cleaned to produce a textured surface. Through a plasma enhanced chemical vapor deposition method, an intrinsic amorphous silicon film was deposited on a front side and a back side of the textured silicon wafer, and then an N-type doped amorphous silicon layer was manufactured on the front side and a P-type doped amorphous silicon layer was manufactured on the back side. Through a magnetron sputtering method, an indium tin oxide with a thickness of 110 m was manufactured as a transparent conductive film on each of the front side and the back side of the silicon wafer, thereby obtaining a solar cell wafer.

Manufacture of Barrier Layer: The solar cell wafer was placed into a cleaning liquid and subjected to an ultrasonic cleaning treatment. The cleaning liquid included 70% of pure water and was at a temperature of 35° C. A layer of copper nitride with a thickness of about 5 nm was deposited as a barrier layer on the transparent conductive film.

Manufacture of Copper Seed Layer: The solar cell wafer was placed into a magnetron sputtering chamber, and a copper seed layer was manufactured on the barrier layer by magnetron sputtering at a power of 200 W, with a flow rate of argon gas of 1000 sccm, a deposition rate of 0.5 nm/s, a deposition time of 340 s, a deposition pressure of 0.5 Pa, a deposition temperature of 40° C., and a deposition thickness of 170 nm.

A copper grid line electrode was manufactured on the copper seed layer.

Comparative Example 3

Manufacture of Solar Cell Wafer: An N-type doped monocrystalline silicon wafer with a thickness of 150 m was selected, textured, and cleaned to produce a textured surface. Through a plasma enhanced chemical vapor deposition method, an intrinsic amorphous silicon film was deposited on a front side and a back side of the textured silicon wafer, and then an N-type doped amorphous silicon layer was manufactured on the front side and a P-type doped amorphous silicon layer was manufactured on the back side. Through a magnetron sputtering method, an indium tin oxide with a thickness of 110 m was manufactured as a transparent conductive film on the front side and the back side of the silicon wafer, thereby obtaining a solar cell wafer.

Manufacture of Barrier Layer: The solar cell wafer was placed into a cleaning liquid and subjected to an ultrasonic cleaning treatment. The cleaning liquid included 70% of pure water and was at a temperature of 35° C. A layer of copper nitride with a thickness of about 5 nm was deposited as a barrier layer on the transparent conductive film.

Manufacture of Copper Seed Layer: The solar cell wafer was placed into an activation solution and subjected to an activation at 30° C. for 5 s. The activation solution included a buffered oxide etch solution and a chemical copper plating activator. The chemical copper plating activator included a nitric acid-palladium chloride replacement solution. The solar cell wafer was transferred to a plating liquid and subjected to an ultrasonic copper plating, with a thickness of the plated copper seed layer controlled to 170 nm. The plating liquid was composed of the following components: 10 g/L of copper sulfate, 2 mL/L of glyoxylic acid, 4 g/L of ethylenediaminetetraacetic acid, 5 mg/L of bipyridine, and 2 μL/L of each of polyethylene glycol and phenyl polyoxyethylene ether sodium phosphate.

A copper grid line electrode is manufacture on the copper seed layer.

The electrical property and tension were tested for the above-mentioned examples and comparative examples, wherein the electrical property includes an efficiency ($E_{ta}$), an open circuit voltage ($V_{oc}$), a short circuit current ($I_{sc}$), a fill factor (FF), a series resistance ($R_s$), and a parallel resistance ($R_{sh}$) of the solar cell. Taking the tested property of Comparative Example 1 as 100%, and the tested properties of the examples and other comparative examples were normalized, with the results shown in Table 1.

TABLE 1

| | $E_{ta}$ | $V_{oc}$ | $I_{sc}$ | FF | $R_s$ | $R_{sh}$ | Tension |
|---|---|---|---|---|---|---|---|
| Comparative Example 1 | 100% | 100% | 100% | 100% | 100% | 100% | 100% |
| Example 1 | 100.18% | 100.02% | 100.32% | 100.04% | 99.12% | 100.21% | 100.05% |
| Comparative Example 2 | 100.01% | 99.99% | 100.04% | 100.02% | 99.98% | 99.99% | 100.01% |
| Comparative Example 3 | 99.99% | 100.01% | 100.02% | 100.02% | 99.98% | 100.02% | 98.99% |

As shown in Table 1, the short circuit currents of Comparative Examples 2 and 3 are 100.04% and 100.02%, respectively, exhibiting a slight improvement compared to Comparative Example 1. This is primarily due to the ultrasonic cleaning treatment applied to the transparent conductive film before manufacturing the copper seed layer, which reduces the contact resistance. However, the solar cell efficiencies of Comparative Examples 2 and 3 are 100.01% and 99.99%, respectively, indicating that there is substantially no change compared to Comparative Example 1, and suggesting that manufacturing the copper seed layer solely by magnetron sputtering or chemical copper plating does not effectively enhance solar cell efficiency. Additionally, the tension property of Comparative Example 3 shows a significant decrease, mainly because the copper seed layer manufactured by chemical copper plating is relatively loosen and exhibits poor adhesion to the substrate. Therefore, a copper seed layer is typically not manufactured using chemical copper plating.

Example 1 exhibits a short circuit current of 100.32% and an efficiency of 100.18%, representing significant improvements compared to Comparative Examples 1 to 3. This is primarily due to the manufacture of the first copper seed layer by chemical copper plating, followed by the manufacture of the second copper seed layer on the first copper seed layer by magnetron sputtering. The first copper seed layer protects the transparent conductive film from damage during the magnetron sputtering, while the second copper seed layer manufactured by the magnetron sputtering enhances the overall conductivity of the two copper seed layers. The combination of these two copper seed layers mitigates their respective shortcomings and effectively leverages their advantages, resulting in a significant increase in both the short circuit current and the efficiency of the solar cell.

The technical features of the above-mentioned embodiments can be combined arbitrarily. To simplify the description, not all the possible combinations of the technical features in the above-mentioned embodiments are described. However, all of the combinations of these technical features should be considered as within the scope of the present disclosure, as long as such combinations do not contradict with each other.

The above-mentioned embodiments merely illustrate several embodiments of the present disclosure, and the description thereof is specific and detailed, but it shall not be constructed as limiting the scope of the present disclosure. It should be noted that, for a person ordinary skilled in the art, several variations and improvements can be made without departing from the concept of the present disclosure, which are all within the protection scope of the present disclosure. Therefore, the protection scope of the present disclosure shall be defined by the appended claims.

What is claimed is:

1. A method for manufacturing a solar cell, comprising:

manufacturing a barrier layer on a transparent conductive film of a solar cell wafer;

manufacturing a first copper seed layer on the barrier layer by a chemical copper plating method;

manufacturing a second copper seed layer on the first copper seed layer by a sputtering method; and manufacturing a grid line electrode on the second copper seed layer.

2. The method for manufacturing the solar cell according to claim 1, wherein manufacturing the barrier layer comprises: placing the solar cell wafer into a cleaning liquid, ultrasonically cleaning the transparent conductive film, and depositing a material of the barrier layer onto the transparent conductive film that has been ultrasonically cleaned.

3. The method for manufacturing the solar cell according to claim 2, wherein the material of the barrier layer comprises one or more of a transition metal sulfide and a metal nitride.

4. The method for manufacturing the solar cell according to claim 2, wherein the cleaning liquid comprises pure water or a dilute hydrochloric acid solution with a mass concentration of 1% to 10%.

5. The method for manufacturing the solar cell according to claim 1, wherein after manufacturing the barrier layer and before manufacturing the first copper seed layer, the method for manufacturing the solar cell further comprises placing the solar cell wafer into an activation solution to be subjected to a copper plating activation treatment.

6. The method for manufacturing the solar cell according to claim 5, wherein the activation solution comprises a buffered oxide etch solution and a chemical copper plating activator.

7. The method for manufacturing the solar cell according to claim 1, wherein the first copper seed layer has a thickness of 10 nm to 200 nm.

8. The method for manufacturing the solar cell according to claim 1, wherein the second copper seed layer has a thickness of 100 nm to 200 nm.

9. The method for manufacturing the solar cell according to claim 1, wherein the barrier layer has a thickness of 1 nm to 10 nm.

10. The method for manufacturing the solar cell according to claim 1, wherein in manufacturing the second copper seed layer, a deposition rate is 0.4 nm/s to 1.0 nm/s.

11. The method for manufacturing the solar cell according to claim 1, wherein in manufacturing the second copper seed layer, a temperature is 20° C. to 60° C.

12. The method for manufacturing the solar cell according to claim 1, wherein the grid line electrode is manufactured by chemical copper plating or electrochemical copper plating.

13. The method for manufacturing the solar cell according to claim 1, wherein the solar cell wafer further comprises a silicon substrate, a front intrinsic amorphous silicon layer, a front doped amorphous silicon layer, a back intrinsic amorphous silicon layer, and a back doped amorphous silicon layer, the front intrinsic amorphous silicon layer and the front doped amorphous silicon layer are sequentially stacked on a front side of the silicon substrate, the back intrinsic amorphous silicon layer and the back doped amorphous silicon layer are sequentially stacked on a back side of the silicon substrate, and there are two transparent conductive films disposed on the front doped amorphous silicon layer and the back doped amorphous silicon layer, respectively.

14. A solar cell comprising:

a solar cell wafer comprising a transparent conductive film;

a barrier layer disposed on the transparent conductive film;

a first copper seed layer manufactured by a chemical copper plating method and disposed on the barrier layer;

a second copper seed layer manufactured by a sputtering method and disposed on the first copper seed layer; and a copper grid line electrode disposed on the second copper seed layer.

15. The solar cell according to claim 14, wherein the barrier layer has a thickness of 1 nm to 10 nm.

16. The solar cell according to claim 14, wherein a material of the barrier layer comprises one or both of a transition metal sulfide and a nitride.

17. The solar cell according to claim 14, wherein the first copper seed layer has a thickness of 10 nm to 200 nm.

18. The solar cell according to claim 14, wherein the second copper seed layer has a thickness of 100 nm to 200 nm.

19. The solar cell according to claim 14, wherein the solar cell wafer further comprises a silicon substrate, a front intrinsic amorphous silicon layer, a front doped amorphous silicon layer, a back intrinsic amorphous silicon layer, and a back doped amorphous silicon layer, the front intrinsic amorphous silicon layer and the front doped amorphous silicon layer are sequentially stacked on a front side of the silicon substrate, the back intrinsic amorphous silicon layer and the back doped amorphous silicon layer are sequentially stacked on a back side of the silicon substrate, and there are two transparent conductive films disposed on the front doped amorphous silicon layer and the back doped amorphous silicon layer, respectively.

* * * * *